United States Patent [19]

Song

[11] Patent Number: 5,483,297
[45] Date of Patent: Jan. 9, 1996

[54] SOUND CARRIER DETECTING CIRCUIT

[75] Inventor: Jang H. Song, Anyang, Rep. of Korea

[73] Assignee: Samsung Electronics Co., Ltd., Kyungki, Rep. of Korea

[21] Appl. No.: 294,781

[22] Filed: Aug. 9, 1994

[30] Foreign Application Priority Data

Aug. 20, 1993 [KR] Rep. of Korea ............... 93-16138

[51] Int. Cl.$^6$ .............................. H04N 5/60; H04N 5/62
[52] U.S. Cl. ................... 348/737; 348/738; 455/315; 455/208
[58] Field of Search ............................ 348/725, 726, 348/736, 737, 738, 735, 731; 455/315, 316, 296, 179.1, 180.1, 191.3, 191.1, 196.1, 209, 208, 255, 256; H04N 5/44, 5/60, 5/62

[56] References Cited

U.S. PATENT DOCUMENTS

| | | | |
|---|---|---|---|
| 3,614,627 | 10/1971 | Runyan | 455/316 |
| 3,639,840 | 2/1972 | Shekel et al. | 455/315 |
| 4,152,669 | 5/1979 | Lgarashi | 455/316 |
| 4,262,307 | 4/1981 | Brun et al. | 348/731 |
| 4,630,119 | 12/1986 | Okuro | 348/737 |

FOREIGN PATENT DOCUMENTS 0020733  1/1989  Japan .................... 455/296

Primary Examiner—Victor R. Kostak
Assistant Examiner—Michael H. Lee
Attorney, Agent, or Firm—Sughrue, Mion, Zinn, Macpeak & Seas

[57] ABSTRACT

A sound carrier detecting circuit for use in a television or a video tape recorder is disclosed. During the sound carrier detection, the carrier frequency of the sound signals is corrected by utilizing pulse width modulation signals output from a microprocessor, so that the noise due to shifting of the detected frequency can be eliminated. The circuit includes a key input part provided with one or more keys for selecting a tuning state, and a microprocessor for outputting pulse width modulating signals and manual sound tuning signals in response to appropriate settings of the key input means. A variable oscillating part for converting the pulse width modulating signals into dc component signals and, in turn, outputting variable frequency signals in accordance with the level of the dc component signals is provided alongside a frequency modulating and oscillating part which oscillates and outputs set frequency signals set to a specific frequency in accordance with the relevant broadcasting method. A switching part selects between the variable oscillating part and the frequency modulating and oscillating part in accordance with the state selected by the key input part. The detecting circuit eliminates the noise due to the shifting of the frequency, and can be applied to all types of video signal receiving apparatuses.

9 Claims, 2 Drawing Sheets

SOUND CARRIER DETECTING CIRCUIT

BACKGROUND OF THE INVENTION

1. Field of the Invention

The present invention relates to a sound carrier detecting circuit for use in a television or a video tape recorder, in which, during the sound carrier detection, a carder frequency of sound signals is corrected by utilizing pulse width modulation signals output from a microprocessor, so as to eliminate noise.

The following disclosure is based on Korean Patent Application 93- 16138, filed Aug. 20, 1993, the disclosure of which is hereby incorporated into the present application by reference.

2. Description of the Background Art

Generally in a television or in a video tape recorder, there is installed a receiving device having a tuner for receiving signals output from a transmitting end. When a very high frequency (VHF) channel or an ultra-high frequency (UHF) channel is selected, the tuner converts signals from the selected channel into an intermediate frequency which is easy to demodulate. Then the output signals of the tuner are demodulated, and the demodulated signals are detected as video signals and sound signals and are then supplied to a video signal processing part and to a sound signal processing part, respectively.

For the conventional circuit which carries out the channel selection, the demodulation and the detection as mentioned above will be described as to its operations in detail, referring to FIG. 1.

FIG. 1 is a block diagram showing the constitution of a conventional receiving device.

The signals which are transmitted from a television broadcasting station or from a transmitting station are received through an antenna 2 to a tuner 10, and the received signals are subjected to a channel selection. The channel-selected signals are mixed with oscillating signals to be generated by a local oscillator (not shown) installed within the tuner 10. The mixed signals correspond to a frequency difference between the channel-selected signals and the oscillating signals of the local oscillator. The signals under this condition are an intermediate frequency (to be called IF below), and the IF is predetermined in each broadcasting method.

In the case of the NTSC (National Television System Committee) broadcasting method, the IF value for each channel is 45.75 MHz for video signals, and 41.25 MHz for sound signals. The reason why the received signals are convened into the IF signals is for facilitating the demodulation.

The IF signals are output to an IF signal output terminal IF of the tuner 10, and are amplified by an IF signal amplifier 20. Then they are input into a saw-tooth filter 30 by which the signals are deprived of extra channel band signals before being output.

The output signals are demodulated by a demodulator 40. During the demodulation, in order to demodulate the video signals to standard signals, the demodulator 40 is provided with a video signal detecting part 42, which includes an inductor L and a capacitor C in parallel. The signals demodulated by the demodulator 40 are output to a video signal compensating part 50 and a sound signal detecting part 60 respectively. The video signal compensating part 50, which is installed on an output side of the demodulator 40, includes a sound trap 52, a picking part 54 and a buffer 56.

Now the procedure for detecting and outputting the video signals will be described. The signals which are demodulated by the demodulator 40 are input into the sound trap 52 so as to be deprived of sound signals. The sound trap 52 filters off the frequency band containing the sound signals, so that only the video signals should be output. During the removal of the sound signals in the sound trap 52, the video signals of high band level are damped. The damped video signals are compensated by the picking part 54 and, then, are input to the buffer 56 so as to be adjusted to a proper output level. These output level-adjusted video signals are provided to a video signal processing part (not shown).

The sound signal detecting part 60 includes a sound band pass filter 62, a frequency modulation (FM) detector 64 and a de-emphasis circuit 66. This sound signal detecting part 60 will now be described as to its operation. The signals which have been demodulated by the demodulator 40 are input into the sound band pass filter 62, so that extra sound band signals should be filtered off from the demodulated signals. Then the FM detector 64 detects FM signals from the signals which have been filtered by the sound band pass filter 62. An FM oscillating part 70 is connected to one side of the FM detector 64.

The FM oscillating part 70 furnishes a certain frequency which is set by the broadcasting station. For example, in the NTSC method, the furnished oscillating frequency is 4.5 MHz, while in the PAL method, the furnished oscillating frequency is 5.5 MHz or 6.0 MHz.

The sound signals which have been detected by the furnished oscillating frequency are input into the de-emphasis circuit 66. Then the high frequency band output of the sound signals is damped by a time constant of an internal circuit of the de-emphasis circuit 66 and, then, the signals are output to a sound processing part (not shown). The reason why the high frequency band signals are damped is that the broadcasting station carries out a pre-emphasis process to reinforce the high frequency band signals for eliminating the noise which is generated during the transmission. Thus, the output characteristics for the respective frequency band of the sound signals output to the sound signal processing part are made uniform by damping the output of the high frequency band output.

However, in the normal case, the sound carder frequency has to be received with a certain band width depending on the broadcasting method, as described above by way of example based on the picture signal carrier frequency. However, in the actual case, the frequency can be shifted depending on the transmitting state of the broadcasting station and on the propagation medium. That is, if a frequency of a picture signal carrier is shifted, the sound carrier frequency separated by a certain band from the picture signal carder frequency is also shifted, with the result that an accurate detection cannot be carried out, thereby generating noise during the outputting of the sound signals.

In more detail, the conventional receiving device of FIG. 1 is described referring to FIG. 2, which illustrates the frequency band of the signals detected after the demodulation. In FIG. 2, reference code P indicates a picture signal carder frequency, C indicates a color signal carrier frequency, and S indicates a sound signal carrier frequency. As shown in FIG. 2, generally, the difference between the picture signal carrier frequency P and the sound signal carrier frequency S is about 4.5 MHz, and this is the same for all the channels.

However, if the sound signal carrier frequency is shifted by the transmitting state of the broadcasting station or by the propagating medium as described above, the carrier frequency P of the picture signals is transmitted as shown by the dotted lines in FIG. 2. That is, the carrier frequency P of the picture signals is shifted. Further, the carrier frequency S of the sound signals which is separated from the carrier frequency P of the picture signals by about 4.5 MHz is also shifted. This chain reaction is generated whenever the carder frequency of the picture signals has been shifted, since the carrier frequency S of the sound signals is always to be separated by a certain band width from the carder frequency P of the picture signals.

For the reason as described above, when the sound signals are detected and output, noise is generated.

Meanwhile, U.S. Pat. No. 5,177,613 discloses a technique in which the noise is damped by using a single saw-tooth filter for filtering the signals tuned in the conventional manner, thereby providing a high quality wide band sound signal processing circuit. However, this is a device provided with a saw-tooth filter having band characteristics for both audio signals and video signals.

SUMMARY OF THE INVENTION

The present invention is intended to overcome the above described disadvantages of the conventional techniques.

Therefore it is an object of the present invention to provide a sound carrier detecting circuit in which the transition of the sound carrier frequency is corrected by utilizing pulse width modulation signals output by a microprocessor, so that noise can be eliminated from the output sound signals.

In achieving the above object according to the present invention, the sound carder detecting circuit comprises: key input means provided with one or more keys for tuning; a microprocessor for outputting pulse width modulating signals and manual sound tuning signals upon key-inputting through the key input means; variable oscillating means for converting the pulse width modulating signals into dc component signals to output variable frequency signals in accordance with the level of the dc component signals; a frequency modulating and oscillating means for oscillating and outputting set frequency signals into the frequency set in accordance with the relevant broadcasting method; and switching means for selectively supplying the oscillated output from the variable oscillating means or the frequency modulating and oscillating means to a frequency modulating and detecting part under the control of the manual sound tuning signal.

BRIEF DESCRIPTION OF THE DRAWINGS

The above object and other advantages of the present invention will become more apparent by describing in detail the preferred embodiment of the present invention with reference to the attached drawings, in which.

DESCRIPTION OF THE PREFERRED EMBODIMENT

Figure 3:
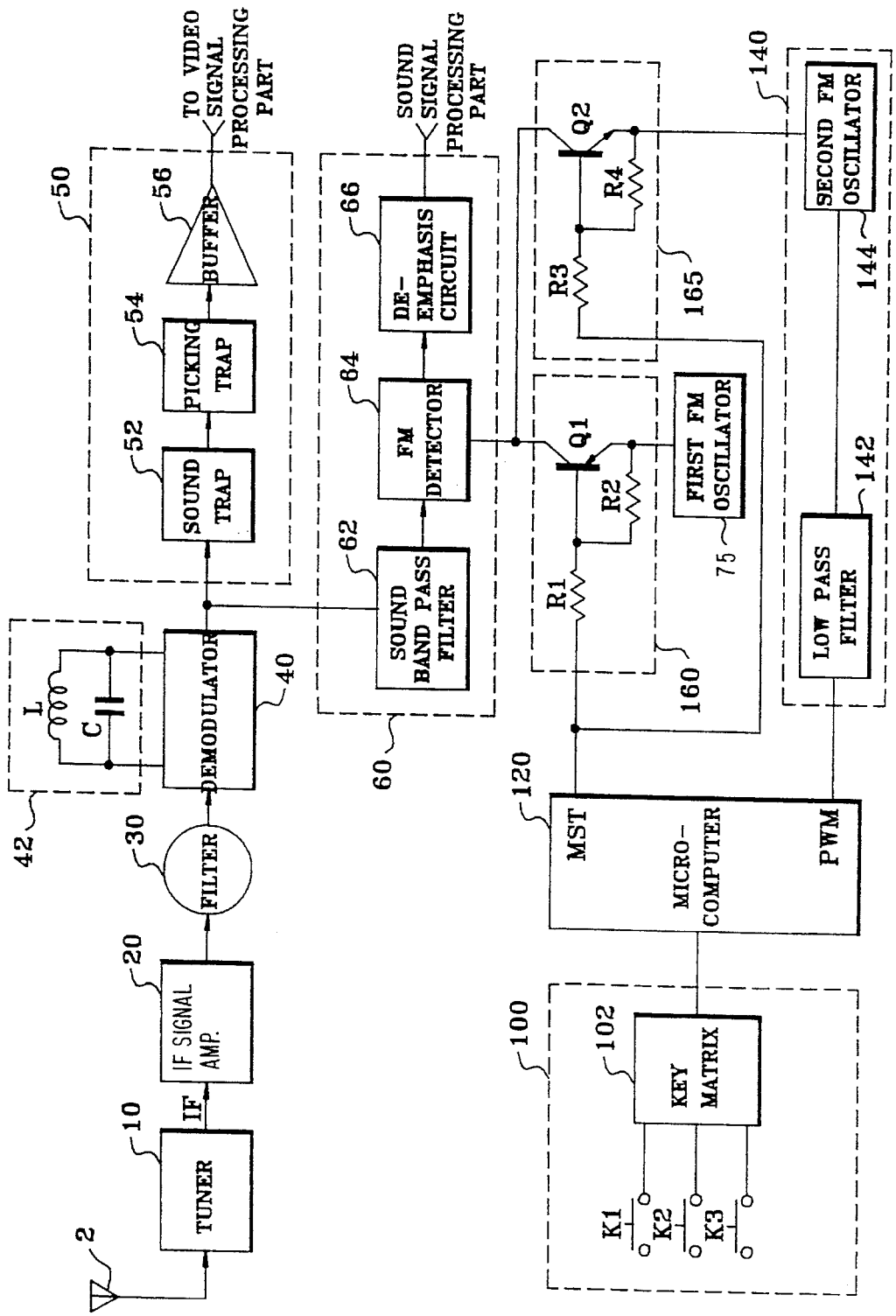
FIG. 3 is a block diagram showing the constitution of a sound carrier detecting circuit according to the present invention.

FIG. 3 illustrates the construction of the sound carrier detecting circuit according to the present invention.

Figures 1, 2:
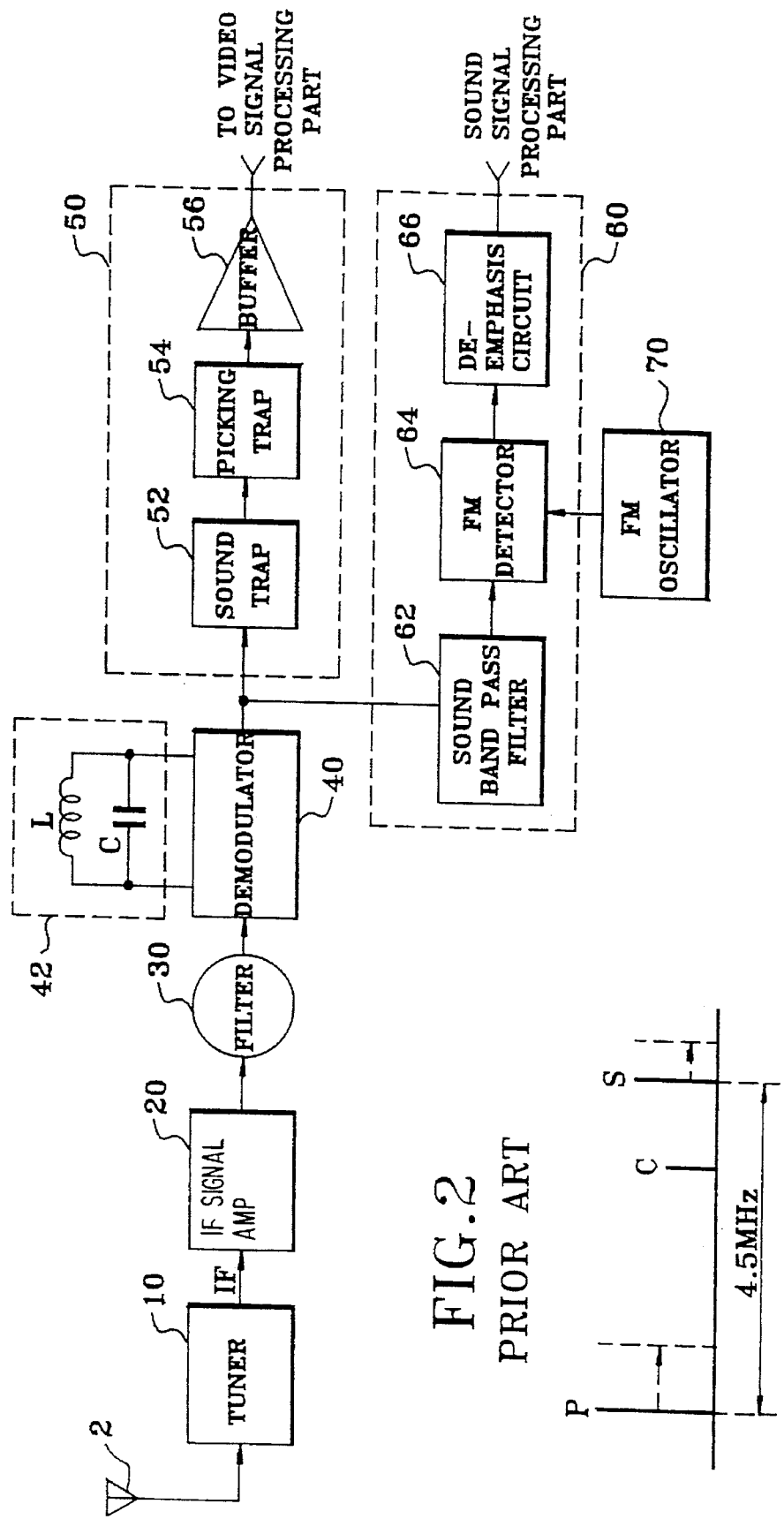
FIG. 1 is a block diagram showing the constitution of a conventional receiving device.
FIG. 2 illustrates a frequency band detected after a demodulation by the conventional receiving device.

Reference numerals of FIG. 3 which are the same as those of FIG. 1 indicate the same or analogues elements, and therefore, the description of these elements will be omitted.

Referring to FIG. 3, a key input part 100 includes a plurality of keys K1–K3 and a key matrix 102 for manual sound tuning, and the key input part 100 is connected to a microprocessor 120. The microprocessor 120 is provided with an output terminal MST for the manual sound tuning, and the other output terminal PWM for outputting pulse width modulating signals. The key K1 of the key input part 100 is a manual sound setting key, the key K2 is a plus varying key, and the key K3 is a minus varying key.

The pulse width modulation signal outputting terminal PWM is connected to a variable oscillating means 140 which includes a low pass filter 142 and a second FM oscillating part 144. The variable oscillating means 140 will be described in further detail below. The low pass filter 142 flattens pulse width modulated signals into a dc component, and an output terminal of the low pass filter 142 is connected to the second FM oscillating part 144. Therefore, in accordance with the level of the dc component signals output from the low pass filter 142, the output frequency of the second FM oscillating part 144 is varied. Further, the level of the dc component for varying the frequency is varied in accordance with the pulse duty of the pulse width modulated signals.

Meanwhile, the manual sound tuning signal output terminal of the microprocessor 120 is connected through resistors R1 and R3 of a first switch 160 and a second switch 165 to the bases of transistors Q1 and Q2. Emitters of the transistors Q1 and Q2 are connected to a first FM oscillating part 75 and the second FM oscillating part 144. Collectors of the transistors Q1 and Q2 are connected to an FM detector 64, while the bases and emitters thereof are connected to resistors R2 and R4.

The operation of the circuit of the present invention constituted as above will now be described.

As described above with reference to FIG. 1, waves received through an antenna 2 are channel-selected, and demodulated based on the video signals. Then they are output to a video signal compensating part 50 and to a sound signal detector 60.

The video signal compensating part 50 removes the noise component of the video signals, and adjusts the level before outputting them. A sound band pass filter 62 filters off extra sound band signals, and the filtered sound signals are input into the FM detector 64. The signals which have been detected by the FM detector 64 are de-emphasized by a de-emphasis circuit 66 and thereafter output.

During the above described process, when the FM detector 64 carries out detections, if there is no key input by the user, then the microprocessor 120 outputs a low level sound manual tuning signal. Then the transistor Q1 of the first switch 160 is turned on, while the transistor Q2 of the second switch 165 is turned off. Thus the FM detector 64 detects the sound signals corresponding to the frequency which is furnished by the first FM oscillating part 75.

However, in the case where the sound carrier frequency is shifted from a transmitting end, if the sound signals are detected based on the oscillated frequency of the first FM oscillating part 75, no accurate detection is made due to the difference between the oscillated frequency and the twisted frequency.

Thus when noise is present, the user can press the manual sound setting key K1 of the key input part 100 so as to eliminate the noise. Accordingly, the key input from the key K1 of the key input part 100 is supplied from the key matrix circuit 102 to the microprocessor 120.

Then the microprocessor 120 outputs a high level manual sound tuning signal in accordance with the manual sound setting signal which is input from the key matrix 102. Then a high level signal is supplied to the base of the transistor Q1 of the first switch 160, and therefore, the transistor Q1 is turned off, while the transistor Q2 of the second switch 165 is turned on by receiving a high level signal into its base.

Thus the oscillation frequency signals varied by the second FM oscillating part 144 are supplied to the FM detector 64, and therefore a manual sound tuning state is achieved, such that the carder frequency of the output sound signals can be adjusted.

If the manual setting state is set as described above, the plus varying key K2 and the minus varying key K3 of the key input part 100 can be manipulated to input tuning signals from the key matrix 102 into the microprocessor 120, thereby eliminating the noise.

First, if the plus varying key K2 is manipulated, the duty of the pulse width modulation signals output from the microprocessor 120 is reduced, with the result that the level of the dc component signals output from the low pass filter 142 is raised. Accordingly, the frequency which is oscillated by the second FM oscillating part 144 is raised.

On the other hand, if the minus varying key K3 is manipulated, the duty of the pulse width modulation signals output from the microprocessor 120 is increased, with the result that the level of the dc component signals output from the low pass filter 142 is lowered. Consequently, the frequency of the output of the second FM oscillating part 144 is lowered.

Thus, the shifted carrier frequency can be adjusted by manipulating the keys of the key input part 100. As described, this manipulation adjusts the duty of the pulse width modulation signals of the microprocessor 120, which, in turn, adjusts the frequency of the output from the second FM oscillating part 144. The band width of the correcting frequency furnished by the second FM oscillating part 144 is preferably about 4–7 MHz.

As a result, the carrier frequency is varied within the range of the above mentioned band width, and this will be described with reference to FIG. 2. That is, the tuning of the shifted frequency is carried out within the range of the correcting frequency band width, and therefore, the tuning is corrected roughly to the sound signal frequency S which is indicated by the solid lines, thereby eliminating the noise.

According to the present invention as described above, when detecting the sound carrier of a received signal, the carrier frequency of the sound signals is corrected by utilizing pulse width modulation signals output from a microprocessor, so that the noise due to the shifting of the frequency of the received signal can be eliminated.

What is claimed is:

1. A sound carrier detecting circuit comprising:
   key input means provided with at least one key for selecting tuning states;
   a microprocessor for outputting pulse width modulating signals and manual sound tuning signals in accordance with the selected tuning state of said key input means;
   variable oscillating means for convening the pulse width modulating signals into dc component signals that, in turn, generate variable frequency signals in accordance with a level of the dc component signals;
   frequency modulating and oscillating means for oscillating and thereby outputting set frequency signals at a frequency set in accordance with a relevant broadcasting method; and
   switching means for selectively supplying the variable frequency signals of said variable oscillating means and the set frequency signals of said frequency modulating and oscillating means to a frequency modulating and detecting part under control of the manual sound tuning signals.

2. The circuit as claimed in claim 1, wherein said key input means comprises:
   a manual sound tuning key for setting a manual sound tuning state corresponding to a given oscillated frequency;
   a plus varying key for increasing the oscillated frequency; and
   a minus varying key for decreasing the oscillated frequency.

3. The circuit as claimed in claim 1, wherein said switching means comprises:
   a first switch for outputting the set frequency signals of said frequency modulating and oscillating means to the frequency modulating and detecting part in response to a non-manual sound tuning state of said key input means; and
   a second switch for outputting the variable frequency signals from the variable oscillating means to the frequency modulating and detecting part in response to a manual sound tuning state of said key input means.

4. A circuit for processing an information signal even if a carrier frequency of the information signal is shifted, comprising:
   a selector having at least a first setting in which said selector outputs a selection signal;
   a processor that, in response to input of the selection signal, outputs at least a first processor signal;
   a variable oscillating section that, in response to input of the first processor signal, outputs an oscillator signal of a frequency determined by the first processor signal;
   a detector having a first input for the information signal and having a second input, wherein said detector outputs signals received at the first input that have frequencies that correspond to frequencies detected at the second input; and
   a switch for passing the oscillator signal to the second input of said detector in response to the selection signal.

5. A circuit according to claim 4, wherein said selector comprises frequency-adjusting keys which adjust the first processor signal.

6. A circuit according to claim 4, wherein said processor comprises a microcomputer, and the first processor signal is a pulse-width modulated signal.

7. A circuit according to claim 4, wherein said processor outputs a second processor signal in response to input of the selection signal; said switch comprises an input for the second processor signal; and the second processor signal triggers said switch to pass the oscillator signal.

8. A circuit according to claim 4, wherein said variable oscillating section comprises a frequency modulation oscillator.

9. A circuit according to claim 4, further comprising a fixed oscillating section which outputs an oscillator signal of a fixed frequency; and wherein said selector has a second setting which triggers said processor to output a second processor signal; said switch comprises an input for the second processor signal; and the second processor signal triggers said switch to pass the fixed-frequency oscillator signal.

* * * * *